United States Patent [19]

Ledzius et al.

[11] Patent Number: 5,323,157
[45] Date of Patent: Jun. 21, 1994

[54] SIGMA-DELTA DIGITAL-TO-ANALOG CONVERTER WITH REDUCED NOISE

[75] Inventors: Robert C. Ledzius, Austin; James S. Irwin, Paige, both of Tex.

[73] Assignee: Motorola, Inc., Schaumburg, Ill.

[21] Appl. No.: 4,816

[22] Filed: Jan. 15, 1993

[51] Int. Cl.$^5$ .............................................. H03M 3/02
[52] U.S. Cl. ................................. 341/143; 341/136; 364/724.16
[58] Field of Search ............... 341/118, 136, 143, 144; 364/724.16, 825

[56] References Cited

U.S. PATENT DOCUMENTS

| | | | |
|---|---|---|---|
| 3,659,229 | 4/1972 | Milton | 364/724.16 |
| 4,156,876 | 5/1979 | DeBuisser | 364/724.16 |
| 4,544,919 | 10/1985 | Gerson | 341/75 |
| 4,777,612 | 10/1988 | Tomimitsu | 364/724.13 |
| 4,943,807 | 7/1990 | Early et al. | 341/120 |
| 5,008,674 | 4/1991 | De Franca et al. | 341/150 |
| 5,012,245 | 4/1991 | Scott et al. | 341/150 |
| 5,057,840 | 10/1991 | Ledzius et al. | 341/144 |
| 5,157,395 | 10/1992 | Del Signore et al. | 341/143 |
| 5,220,326 | 6/1993 | Ledzius et al. | 341/118 |
| 5,222,035 | 6/1993 | Nakase et al. | 364/724.16 |

*Primary Examiner*—Marc S. Hoff
*Attorney, Agent, or Firm*—Paul J. Polansky

[57] ABSTRACT

A sigma-delta digital-to-analog converter (DAC) (40) receives oversampled input data representative of an analog signal. The data may be optionally interpolated to a higher rate in a interpolator (41). A noise-shaping sigma-delta modulator (42) is connected to the output of the interpolator (41). The output of the modulator (42) is provided to a finite impulse response (FIR) filter (43). The FIR filter (43) has a frequency response characteristic which reduces the shaped noise and aliased components. This noise has a tendency to intermodulate back into the DAC's passband. The FIR filter (43) uses a series of flip-flops (81, 82, 83) functioning as delay elements with well-controlled timing edges. The outputs of the flip-flops (81, 82, 83) control current sources (91, 92, 93) weighted according to corresponding filter coefficients. The outputs of the current sources (91, 92, 93) are then summed in a summing device such as an amplifier (101).

10 Claims, 4 Drawing Sheets

*91*

*200*

5,323,157

SIGMA-DELTA DIGITAL-TO-ANALOG CONVERTER WITH REDUCED NOISE

CROSS REFERENCE TO RELATED, COPENDING APPLICATION

Related, copending application is U.S. patent application Ser. No. 07/860,540, filed Mar. 30, 1992 by now U.S. Pat No. 5,231,395, issued Jul. 27, 1993, James S. Irwin, Robert C. Ledzius, and Dhirajlal Manvar and assigned to the assignee hereof, entitled "Sigma-Delta Digital-to-Analog Converter with Reduced Distortion".

FIELD OF THE INVENTION

This invention relates generally to digital-to-analog converters, and more particularly, to digital-to-analog converters using sigma-delta modulators.

BACKGROUND OF THE INVENTION

There are two basic techniques used in digital-to-analog converters (DACs). These are the sigma-delta technique and the resistive or capacitive divider techniques. The sigma-delta technique is attractive because it achieves high resolution by precise timing instead of precisely-matched on-chip components such as resistors. In addition, the expertise needed to produce thin-film, laser-trimmed analog components is difficult to obtain; whereas, high-speed digital switching capability is commonplace in the semiconductor industry.

A basic sigma-delta DAC receives a digital input signal which is summed with inverse feedback of the output signal to provide an error signal. The error signal is then processed through an integrator and a comparator to provide the analog output signal. The sigma-delta DAC is able to shape the quantization noise out of the audio signal range, and any noise beyond that range is imperceptible to the listener in an ideal implementation. The output of an ideal sigma-delta modulator can thus be used as the DAC analog output signal.

However, added filtering is required for non-ideal following amplifier stages because the out-of-band noise tends to intermodulate back into the passband. Sigma-delta modulators often require oversampled data which would be provided by an interpolator. The DAC's input data may be at the Nyquist rate or may require interpolation to a higher rate before being provided to the sigma-delta modulator. The sigma-delta modulator is clocked using a high-speed digital clock, which may be different from the DAC's input clock. In general, noise present near multiples of these clock frequencies does not affect the analog output signal, because these frequencies are well beyond the passband of the signal of interest. However, this noise has a tendency to intermodulate back into the passband when nonlinearities, such as rise- and fall-time mismatch of the modulator output, are present. For example, a modulator based on complementary metal-oxide-semiconductor (CMOS) transistor technology has an output driver using both a P-channel and N-channel transistors. The thresholds of these transistors are difficult to match, and there may be differences in speed of the output signal depending on whether the output driver is switching high or low.

The modulator output signal is commonly filtered in an analog smoothing filter, but there are problems with this approach. The analog smoothing filter should have an order at least one greater than that of the modulator and the filter must be complex if it is to reduce aliased outputs. Ironically, the sigma-delta architecture was intended to simplify the implementation of the data converter. What is needed, then, is a sigma-delta DAC architecture with improved signal-to-noise ratio (SNR) and reduced complexity.

SUMMARY OF THE INVENTION

Accordingly, there is provided, in one form, a sigma-delta digital-to-analog converter with reduced noise, comprising a sigma-delta modulator and a finite impulse response (FIR) filter. The sigma-delta modulator has an input for sequentially receiving first digital data words, a clock input terminal for receiving a modulator clock signal, and an output terminal for providing a modulator output signal having a value in a passband of the digital-to-analog converter corresponding to the first digital data words. The FIR filter has an input coupled to the output terminal of the sigma-delta modulator, and an output for providing an analog signal. The FIR filter shapes the modulator signal according to a predetermined transfer function, thereby decreasing intermodulated noise in the passband of the sigma-delta digital-to-analog converter.

These and other features and advantages will be more clearly understood from the following detailed description taken in conjunction with the accompanying drawings.

DETAIL DESCRIPTION OF A PREFERRED EMBODIMENT

Figure 1:
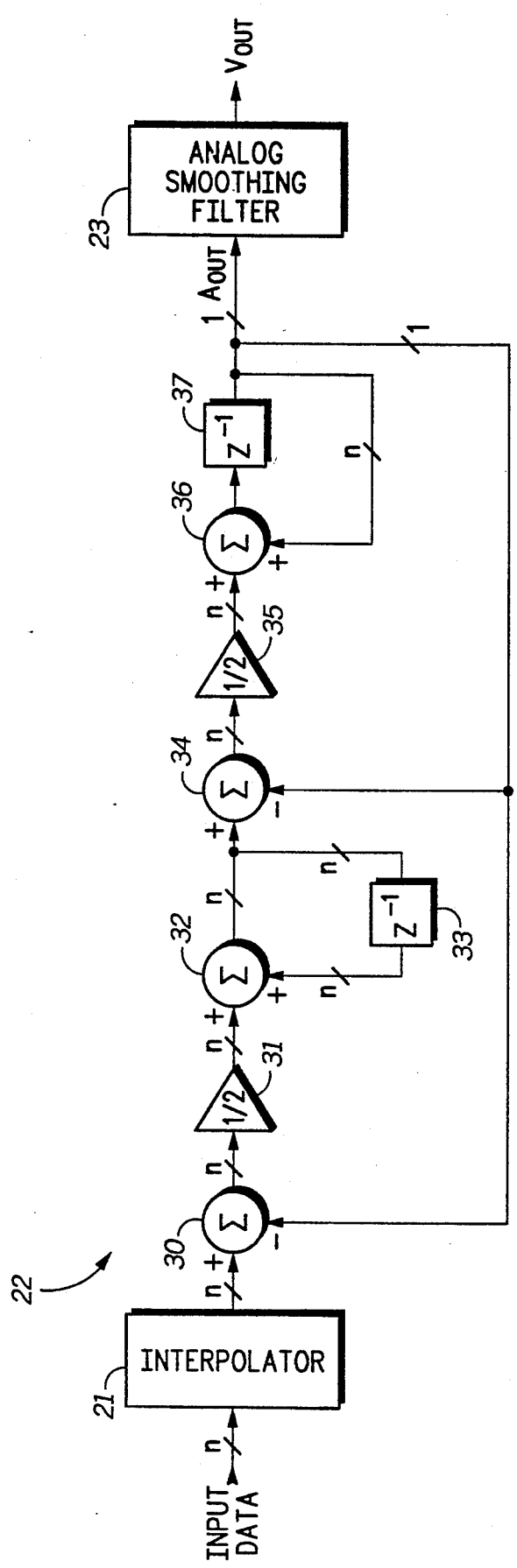
FIG. 1 illustrates in partial block diagram and partial logic diagram form a sigma-delta digital-to-analog converter (DAC) according to the prior art.

FIG. 1 illustrates in partial block diagram and partial logic diagram form a sigma-delta digital-to-analog converter (DAC) 20 according to the prior art. DAC 20 includes generally an interpolator 21, a sigma-delta modulator 22, and an analog smoothing filter 23. Interpolator 21 has an input for receiving an n-bit digital input code labelled "INPUT DATA", and an output for providing an n-bit output signal. Interpolator 21 receives INPUT DATA at a first sampling rate, and provides the n-bit output code at a second, higher sampling rate by performing an interpolation between the samples. The n-bit input code may be oversampled as well.

Sigma-delta modulator 22 has an input for receiving the n-bit output code of interpolator 21, and an output for providing an output signal labelled "$A_{OUT}$". Sigma-delta modulator 22 shapes the quantization noise in $A_{OUT}$ out-of-band, and thus $A_{OUT}$ is a substantially linear analog representation of INPUT DATA within the passband. Analog smoothing filter 23 has an input for receiving signal $A_{OUT}$, and an output for providing an analog output signal labelled "$V_{OUT}$". Analog smoothing filter 23 is a conventional third-order smoothing filter such as a switched-capacitor, passive RC filter, or the like. Analog smoothing filter 23 rejects out-of-band noise which has the potential to intermodulate back into the passband.

In the illustrated embodiment, sigma-delta modulator 22 is a second-order, one-bit modulator providing one-bit output signal $A_{OUT}$. Sigma-delta modulator 22 includes a summing device 30, an amplifier 31, a summing device 32, a delay element 33, a summing device 34, an amplifier 35, a summing device 36, and a delay element 37. Summing device 30 has a positive input terminal for receiving the n-bit output of interpolator 21, a negative input terminal for receiving $A_{OUT}$, and an output terminal for providing an n-bit sum thereof. Amplifier 31 has an input terminal connected to the output terminal of summing device 30, and an output. Summing device 32 has a first positive input terminal connected to the output terminal of amplifier 31, a second positive input terminal, and an output terminal for providing a sum thereof. Delay element 33 has an input terminal connected to the output terminal of summing device 32, and an output connected to the second positive input terminal of summing device 32. Summing device 34 has a positive input terminal connected to the output terminal of summing device 32, a negative input terminal for receiving signal $A_{OUT}$, and an output terminal. Amplifier 35 has an input terminal connected to the output terminal of summing device 34, and an output terminal. Summing device 36 has a first positive input terminal connected to the output terminal of amplifier 35, a second positive input terminal, and an output terminal for providing a sum thereof. Delay element 37 has an input terminal connected to the output terminal of summing device 36, and an output terminal connected to the second positive input terminal of summing device 36. The output of sigma-delta modulator 22 is equal to the most significant bit (MSB) of the output of delay element 37.

DAC 20 requires analog smoothing filter 23 to be at least one order greater than that of sigma-delta modulator 22, i.e., third order, to filter out the large amount of high frequency noise due to the noise shaping of sigma-delta modulator 22. In addition, noise present on the clock edges has a tendency to generate noise in the low frequency passband. A DAC which has reduced noise and reduced complexity is desirable.

Figure 2:
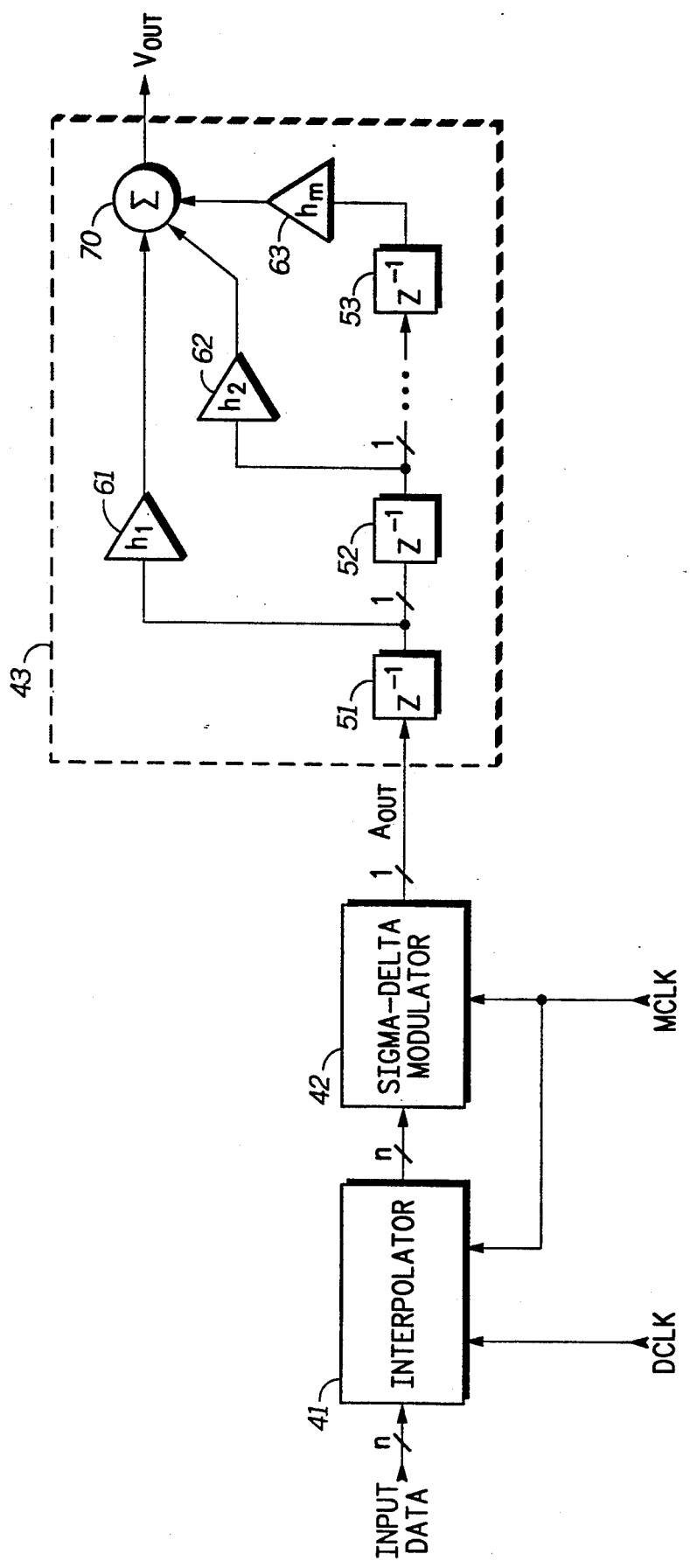
FIG. 2 illustrates in partial block diagram and partial logic diagram form a DAC in accordance with the present invention.

FIG. 2 illustrates in partial block diagram and partial logic diagram form a DAC 40 in accordance with the present invention. DAC 40 is based on CMOS technology and includes generally an interpolator 41, a sigma-delta modulator 42, and a digital finite impulse response (FIR) filter 43. Interpolator 41 has an input terminal for receiving INPUT DATA, a first clock input terminal for receiving a clock signal labelled "DCLK", a second clock input terminal for receiving a clock signal labelled "MCLK", and an output terminal for providing an n-bit output signal. Interpolator 41 receives INPUT DATA at a first sampling rate (the frequency of DCLK), and provides the n-bit output code at the output thereof at a second, higher sampling rate (the frequency of MCLK) by performing an interpolation between the samples. INPUT DATA may already be oversampled as well.

Sigma-delta modulator 42 has an input terminal connected to the output terminal of interpolator 41, a clock input terminal for receiving signal MCLK, and an output terminal for providing output signal $A_{OUT}$. Sigma-delta modulator 42 shapes the quantization noise in $A_{OUT}$ out-of-band, and thus $A_{OUT}$ is a substantially linear analog representation of INPUT DATA within the passband.

FIR filter 43 has an input terminal connected to the output terminal of sigma-delta modulator 42, and an output terminal for providing signal $V_{OUT}$. FIR filter 43 is single-bit, m-stage digital filter which eliminates the need for a complex analog smoothing filter at the output of sigma-delta modulator 42. In addition, FIR filter 43 reduces the requirements placed on interpolator 41 compared to interpolator 23. The filter function and number of tap lengths can be chosen in a way that is optimal for the particular application.

As shown functionally in FIG. 2, FIR filter 43 includes m delay elements each with corresponding amplifier weightings, of which representative delay elements 51, 52, and 53, and representative weighting amplifiers 61, 62, and 63 are illustrated in FIG. 2. Each delay element, labelled "$z^{-1}$", has an input terminal connected to a previous delay element, if any, and an output terminal. Amplifiers 61, 62, and 63 have inputs connected to outputs of corresponding delay elements 51, 52, and 53, outputs connected to corresponding positive inputs of a summing device 70, and multiply the inputs thereof to implement FIR filter coefficients labelled "$h_1$", "$h_2$", and "$h_m$", respectively, associated therewith. Summing device 70 sums the outputs of all the amplifiers and has an output terminal for providing output signal $V_{OUT}$ thereon.

Figure 3:
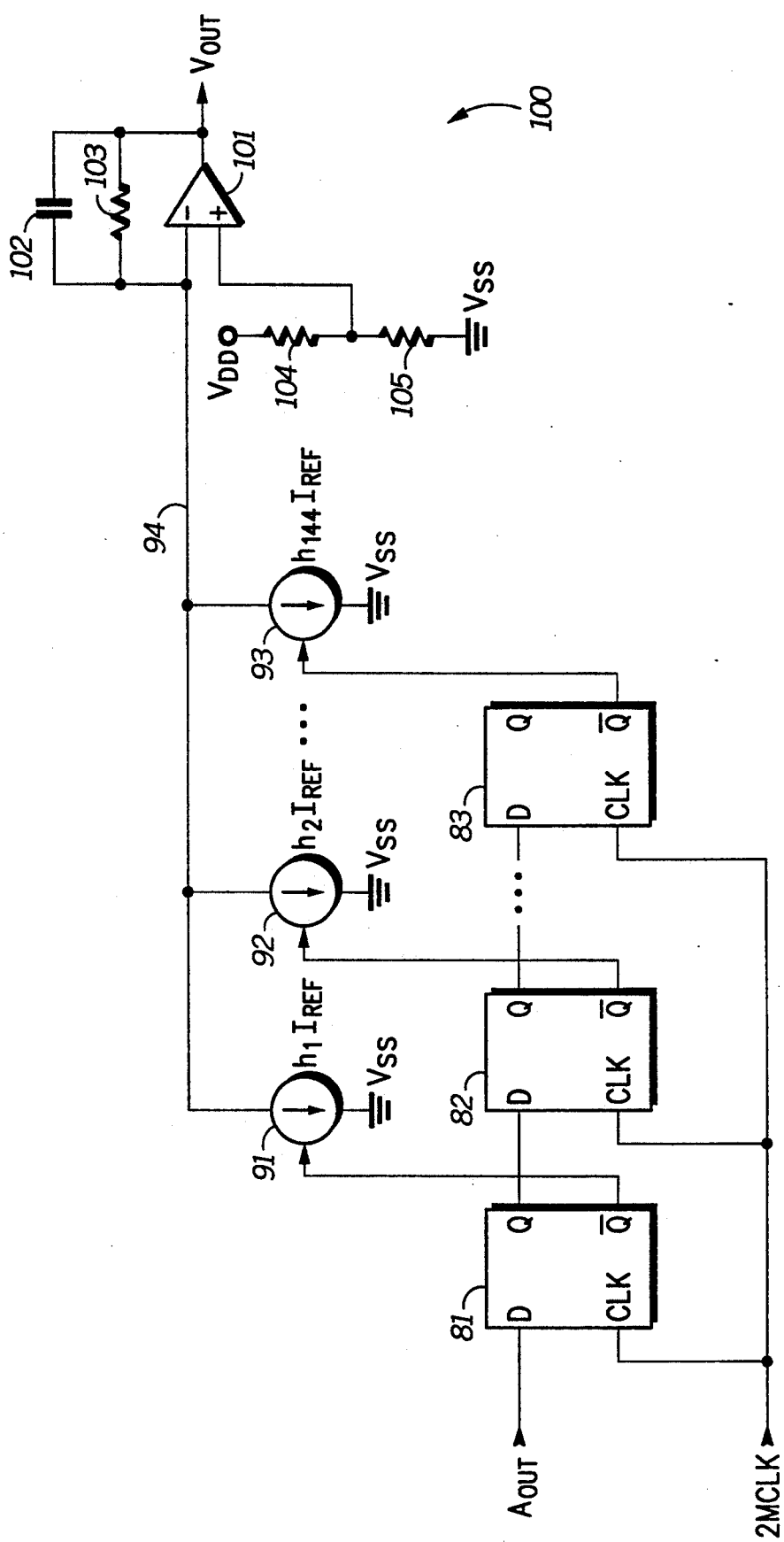
FIG. 3 illustrates in partial block diagram and partial logic diagram form one implementation of the finite impulse response (FIR) filter of FIG. 2.

The actual implementation of filter 43 is better understood with reference to FIG. 3. FIG. 3 illustrates in partial block diagram and partial logic diagram form one implementation 80 of FIR filter 43 of FIG. 2. FIR filter 80 implements a 144-tap FIR filter using 144 D-type flip-flops (corresponding to the delay elements) and 144 controlled current sources (corresponding to coefficient weightings). The outputs of the current sources are connected together and to the input of a summing device 100. FIG. 3 illustrates representative portions of FIR filter 80 including D-type flip-flops 81, 82, and 83, and controlled current sources 91, 92, and 93. Flip-flop 81 has a D input connected to the output of sigma-delta modulator 42, a clock input labelled "CLK" for receiving signal labelled "2MCLK", a Q output for providing a true output signal, and a $\bar{Q}$ output for providing a complementary output signal. 2MCLK is a digital clock signal having frequency twice that of modulator clock MCLK. Flip-flop 82 has a D input connected to the Q output of flip-flop 81, a CLK input for receiving 2MCLK, a Q output provided to a subsequent flip-flop (not shown), and a $\bar{Q}$ output for providing a complementary output signal. Flip-flop 83 has a D input connected to the Q output of a preceding flip-flop (not shown), a CLK input for receiving 2MCLK, an unused Q output, and a $\bar{Q}$ output.

Controlled current source 91 has a first terminal connected to a common node 94, a second terminal connected to a power supply voltage terminal labelled "$V_{SS}$", and an active-low control terminal connected to the $\bar{Q}$ output terminal of flip-flop 81. $V_{SS}$ is a more-negative power supply voltage terminal having a nominal value of approximately zero volts. Controlled current source 92 has a first terminal connected to node 94, a second terminal connected to $V_{SS}$, and an active-low control terminal connected to the $\bar{Q}$ output terminal of flip-flop 82. Controlled current source 93 has a first terminal connected to node 94, a second terminal connected to $V_{SS}$, and an active-low control terminal connected to the $\overline{Q}$ output terminal of flip-flop 84.

Each controlled current source implements a coefficient weighting by conducting a current equal to the associated coefficient times a reference current, which is conducted in response to the $\overline{Q}$ output of the corresponding flip-flop. Representative weightings $h_1 I_{REF}$, $h_2 I_{REF}$, and $h_{144} I_{REF}$ corresponding to current sources 91, 92, and 93, respectively, are illustrated in FIG. 3. Since the FIR filter function is performed only on a single-bit binary data stream, the controlled current sources are able to multiply the data value and the coefficient by either conducting the weighted current (Q=1) or conducting no current (Q=0). FIR filter 80 uses a symmetrical, raised cosine (Hamming window) weighting because such a weighting gives better alias protection and requires a smaller range for the coefficients compared to other weightings. However, other filter responses may be desirable for particular applications. Negative coefficients are also possible by utilizing the true (Q) flip-flop outputs instead of the complementary ($\overline{Q}$) outputs to switch the current sources. For a minimum effect of processing variations on current size, it is preferred when using symmetrical coefficient weightings (such as a Hamming window) to lay out current sources having the same size coefficients adjacent to one another. For example, current source 91 is adjacent to current source 93 since $h_1 = h_{144}$, etc. Note that in other embodiments resistor or capacitor coefficient weightings may be used.

Summing device 100 includes an operational amplifier 101, a capacitor 102, and resistors 103–105. Operational amplifier 101 has a positive input terminal connected to the first terminals of each current source, a negative input terminal, and an output terminal for providing signal $V_{OUT}$. Capacitor 102 has a first terminal connected to the output terminal of operational amplifier 101, and a second terminal connected to the positive input terminal of operational amplifier 101. Capacitor 102 is used to provide additional filtering. Resistor 103 has a first terminal connected to the output terminal of operational amplifier 101, and a second terminal connected to the positive input terminal of operational amplifier 101. Resistor 104 along with $I_{REF}$ set the gain of summing device 100. Resistor 104 has a first terminal connected to a power supply voltage terminal labelled "$V_{DD}$", and a second terminal connected to the negative input terminal of operational amplifier 101. $V_{DD}$ is a more-positive power supply voltage terminal having a nominal voltage of approximately 5.0 volts. Resistor 105 has a first terminal connected to the second terminal of resistor 104, and a second terminal connected to $V_{SS}$. Resistors 104 and 105 are preferably equal-valued to set the voltage at the positive input terminal at mid-supply. In this embodiment, summing device 100 is a conventional operational amplifier integrator, but may be implemented in other conventional forms in other embodiments.

For low distortion applications, it is preferred that input signal $A_{OUT}$ be chopped with a pattern of alternating zeros and ones, as taught by U.S. patent application Ser. No. 07/860,540, which is herein incorporated by reference. A chop circuit (not shown) is placed between the output of sigma-delta modulator 42 of FIG. 2 and the input of FIR filter 80 which alternates the data with ones or zeros. With the chop circuit, the D flip-flops in FIR filter 80 are clocked by 2MCLK, at twice the modulator clock rate, to allow half of an MCLK cycle to be $A_{OUT}$ and the other half to be chopped to an alternating pattern of ones and zeros. In addition to preventing even-order distortion in $V_{OUT}$ by ensuring that a transition always occurs for each flip-flop during any given clock cycle, chopping data in this fashion prevents large current spikes by ensuring that there are approximately as many flip-flops switching to a logic high as to a logic low at any clock transition. By reducing current spikes, the chop circuit maintains the integrity of the output pulses, thereby preventing the introduction of additional distortion due to the current spikes. Note that other chop techniques are possible, such as return-to-one and return-to-zero. In addition, the hardware of FIR filter 80 may be used to implement a 144-tap FIR filter on unchopped data at the MCLK rate.

Figure 4:
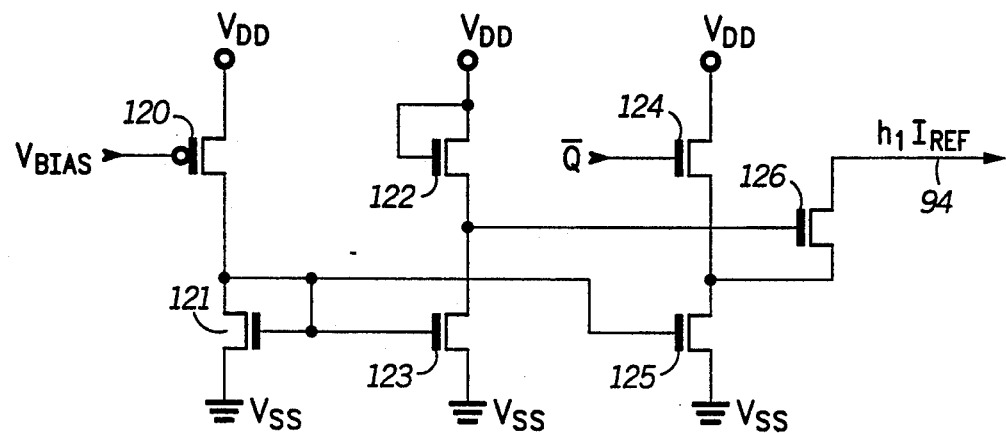
FIG. 4 illustrates in schematic form of one of the controlled current sources of FIG. 3.

FIG. 4 illustrates in schematic form controlled current source 91 of FIG. 3. Controlled current source 91 includes a P-channel transistor 120, and N-channel transistors 121–126. Transistor 120 has a source connected to $V_{DD}$, a gate for receiving a bias voltage labelled "$V_{BIAS}$", and a drain. $V_{BIAS}$ is a voltage which biases P-channel transistor 120 to function as a current source and conduct the current associated with the filter tap, in this case $h_1 I_{REF}$. Transistor 121 has a drain connected to the drain of transistor 120, a gate connected to the drain thereof, and a source connected to $V_{SS}$. Transistor 122 has a drain connected to $V_{DD}$, a gate connected to the drain thereof, and a source. Transistor 123 has a drain connected to the source of transistor 122, a gate connected to the drain of transistor 120, and a source connected to $V_{SS}$. Transistor 124 has a drain connected to $V_{DD}$, a gate for receiving signal $\overline{Q}$ from flip-flop 81 of FIG. 3, and a source. Transistor 125 has a drain connected to the source of transistor 124, a gate connected to the drain of transistor 120, and a source connected to $V_{SS}$. Transistor 126 has a drain connected to node 94 for selectively providing current $h_1 I_{REF}$, a gate connected to the drain of transistor 123, and a source connected to the drain of transistor 125.

Current source 91 is a switched cascode current source. The output current $h_1 I_{REF}$ is set by transistors 120 and 121; the current through transistor 121 is mirrored through transistor 125 and cascode transistor 126. Transistors 122 and 123 are used to set the gate bias voltage for cascode transistor 126. When $\overline{Q}$ is active at a logic low, transistor 124 becomes nonconductive and transistor 126 becomes conductive and a current equal to $h_1 I_{REF}$ is source from node 94. When $\overline{Q}$ becomes inactive at a logic high, the voltage at the drain of transistor 124 rises to a point at which transistor 126 becomes nonconductive, diverting all the current conducted by transistor 125 through transistor 124.

Figure 5:
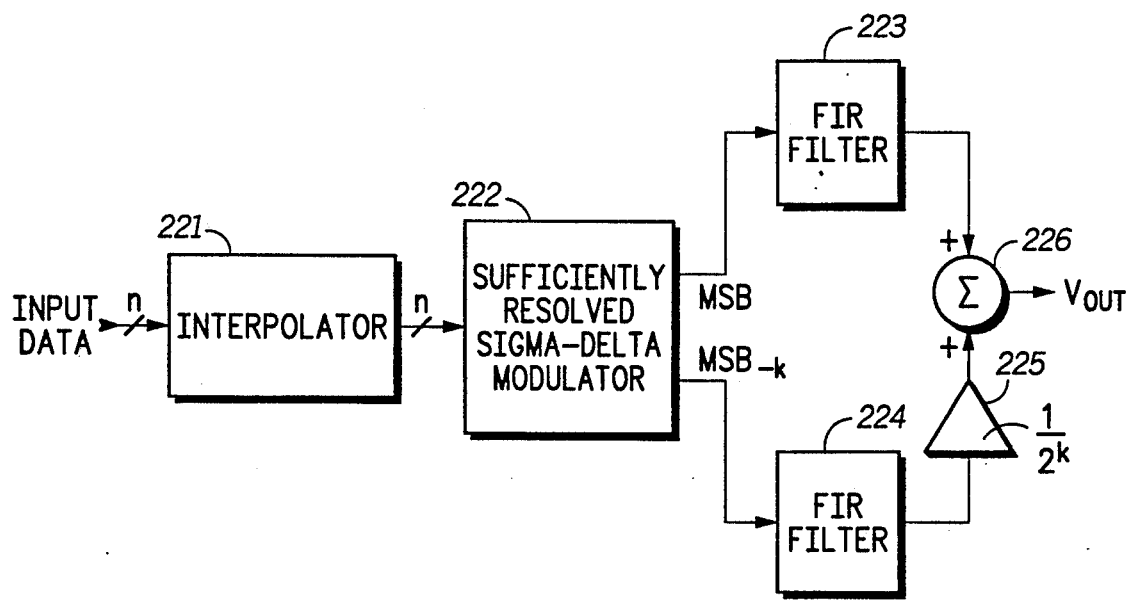
FIG. 5. illustrates in block diagram form a DAC in accordance with a second embodiment of the present invention.

FIGS. 1–4 illustrate a DAC with reduced in-band noise using a single-bit modulator. FIG. 5 illustrates in block diagram form a DAC 200 in accordance with a second embodiment of the present invention. Instead of a single-bit modulator, DAC 200 uses a sufficiently-resolved sigma-delta modulator 222 on the output of integrator 221. The sufficiently-resolved architecture was taught by Ledzius and Irwin in U.S. Pat. No. 5,057,840, entitled "Σ-Δ Modulator for Digital-to-Analog Converter," issued Oct. 15, 1991, which is herein incorporated by reference. The sufficiently resolved sigma-delta modulator uses at least two feedback bits, including the most significant bit (MSB) and a second bit labelled "MSB- k" which is not the MSB or a second-most significant bit. Modulator 202, for example, used two feedback bits.

As taught in U.S. Pat. No. 5,057,840, these bits may be summed and weighted to provide signal $A_{OUT}$. However, in accordance with the present invention, the MSB and second bits are provided to separate FIR filters 223 and 224, respectively, which need not be the same. The output of FIR filter 223 is provided to a first positive input terminal of a summing device 226. The output of FIR filter 224, however, is attenuated by a factor of $(1/(2^k))$ in an amplifier 225 before being provided to a second positive input of summing device 226. An output of summing device 226 provides signal $V_{OUT}$. In an alternate embodiment, the current sources in FIR filter 224 may be scaled by the corresponding bit's relative significance and amplifier 225 omitted. In this alternate embodiment, if the coefficients for FIR filter 223 have a weight of $h_j$, then corresponding coefficients in FIR filter 224 have a weight of $(1/(2^k)) \cdot h_j$.

While the invention has been described in the context of a preferred embodiment, it will be apparent to those skilled in the art that the present invention may be modified in numerous ways and may assume many embodiments other than that specifically set out and described above. For example, sigma-delta modulators of order different than two may be used. In addition, while the illustrated embodiments implemented Hamming windows, other embodiments may include different window functions. An optimal window function is chosen to reject those frequencies which produce out-of-band noise which may be intermodulated back into the passband, and to suppress aliased output components. These frequencies will vary from embodiment to embodiment. By utilizing both positive and negative coefficients, lowpass, highpass, and bandpass filters are all achievable. Accordingly, it is intended by the appended claims to cover all modifications of the invention which fall within the true spirit and scope of the invention.

We claim:

1. A sigma-delta digital-to-analog converter with reduced noise comprising:

a sigma-delta modulator having n input for sequentially receiving first digital data words, a clock input terminal for receiving a modulator clock signal, and an output terminal for providing a modulator output signal having a value in a passband of the digital-to-analog-converter corresponding to said first digital data words; and a finite impulse response (FIR) filter having an input coupled to said output terminal of said sigma-delta modulator, and an output for providing an analog signal;

said FIR filter shaping said second analog signal according to a predetermined transfer function, thereby decreasing intermodulated noise in said passband of the sigma-delta digital-to-analog converter, wherein said FIR filter comprises:

a plurality of delay elements ordered from a first delay element to a last delay element, said first delay element having an input for receiving said modulator output signal, each delay element besides said first delay element having an input coupled to an output of a preceding delay element, each delay element delaying an input thereof by one period of said modulator clock to provide a delayed signal at an output thereof;

a plurality of amplifier means corresponding to each of said plurality of delay elements, each amplifier means having an input coupled to an output of a corresponding one of said plurality of delay elements, and an output, said plurality of delay elements having gains to implement said predetermined transfer function, wherein each of said amplifier means comprises a controlled current source; and a summing device having inputs coupled to each of said output terminals of said plurality of delay elements, and an output terminal for providing said analog signal.

2. The sigma-delta digital-to-analog converter of claim 1 wherein said predetermined transfer function comprises a Hamming window.

3. The sigma-delta digital-to-analog converter of claim 1 wherein each controlled current source is characterized as being a cascode current source.

4. The sigma-delta digital-to-analog converter of claim 1 wherein each controlled current source comprises:

a first transistor having a first current electrode coupled to a first power supply voltage terminal, a control electrode for receiving a bias voltage, and a second current electrode;

a second transistor having a first current electrode coupled to said second current electrode of said first transistor, a control electrode coupled to second first current electrode of said first transistor, and a second current electrode coupled to a second power supply voltage terminal;

a third transistor having a first current electrode coupled to said first power supply voltage terminal, a control electrode coupled to said first power supply voltage terminal, and a second current electrode;

a fourth transistor having a first current electrode coupled to said second current electrode of said third transistor, a control electrode coupled to said second current electrode of said first transistor, and a second current electrode coupled to said second power supply voltage terminal;

a fifth transistor having a first current electrode coupled to said first power supply voltage terminal, a control electrode coupled to an output of a corresponding delay element, and a second current electrode;

a sixth transistor having a first current electrode coupled to said second current electrode of said fifth transistor, a control electrode coupled to said first current electrode of said first transistor, and a second current electrode coupled to said second power supply voltage terminal; and a seventh transistor having a first current electrode for providing an output of said controlled current source, a control electrode coupled to said second current electrode of said third transistor, and a second current electrode coupled to said second current electrode of said fifth transistor.

5. The sigma-delta digital-to-analog converter of claim 4 wherein said first transistor is a P-channel MOS transistor, and wherein said second, third, fourth, fifth, sixth, and seventh transistors are N-channel MOS transistors.

6. A sigma-delta digital-to-analog converter with reduced noise comprising:

noise-shaping means for sequentially receiving first digital data words at a first clock frequency, for shaping quantization noise in said first digital data words out-of-band, and for providing an output signal having an in-band component substantially equal to an analog representation of said first digital data words; and a finite impulse response (FIR) filter having an input for receiving said output signal of said noise-shaping means, and an output for providing an analog signal as an output of the sigma-delta digital-to-analog converter;

said FIR filter shaping said analog signal according to a predetermined transfer function, thereby decreasing intermodulated noise in said passband of the sigma-delta digital-to-analog converter;

said FIR filter implementing a Hamming window.

7. A sigma-delta digital-to-analog converter with reduced noise comprising:

a sufficiently-resolved sigma-delta modulator having an input for receiving first digital data words, a clock input terminal for receiving a modulator clock signal, and an output terminal for providing an output having a plurality of bits including first and second bits;

said first output bit corresponding to a most-significant bit of said output;

said second bit corresponding to a tap bit which is not said most significant or a second most-significant bit of said output;

a first finite impulse response (FIR) filter having an input for receiving said first output bit, and an output for providing a first analog output signal;

a second FIR filter having an input for receiving said second output bit, and an output for providing a second analog signal;

means for weighting an output of said second FIR filter according to a relative significance of said second output bit compared to said first output bit; and summing means coupled to said first and second FIR filters, for summing said first and second analog output signals to provide a third analog output signal which is an output sigma of the sigma-delta digital-to-analog converter;

said first and second FIR filters filtering said first and second bits, respectively, according to predetermined transfer functions, thereby decreasing a potential for intermodulated noise in said passband of the sigma-delta digital-to-analog converter.

8. The sigma-delta digital-to-analog converter of claim 7 wherein said sufficiently-resolved sigma-delta modulator is characterized as being a second-order sigma-delta modulator.

9. The sigma-delta digital-to-analog converter of claim 7 further comprising an interpolator having an input for sequentially receiving second data words at a second clock frequency, and an output for providing said first data words at said first frequency.

10. The sigma-delta digital-to-analog converter of claim 7 wherein each of said first FIR filter and said second FIR filter implements a Hamming window.

* * * * *